United States Patent [19]

Blouse et al.

[11] Patent Number: 5,132,765
[45] Date of Patent: Jul. 21, 1992

[54] NARROW BASE TRANSISTOR AND METHOD OF FABRICATING SAME

[76] Inventors: Jeffrey L. Blouse, Decker Rd., Stanfordville, N.Y. 12581; Inge G. Fulton, 4 Kings Point La., Washingtonville, N.Y. 10492; Russell C. Lange, 371 N. Plank Rd., Newburgh, N.Y. 01550; Bernard S. Meyerson, 235 California Rd., Yorktown Heights, N.Y. 10598; Karen A. Nummy, 145 Fostertown Rd., Newburgh, N.Y. 12550; Martin Revitz, 73 Mandalay Dr., Poughkeepsie, N.Y. 12503; Robert Rosenberg, 101 Lakeview Ave. West, Peekskill, N.Y. 10566

[21] Appl. No.: 648,797

[22] Filed: Jan. 31, 1991

Related U.S. Application Data

[62] Division of Ser. No. 405,508, Sep. 11, 1989, Pat. No. 5,008,207.

[51] Int. Cl.$^5$ .............. H01L 29/72; H01L 29/34; H01L 29/04
[52] U.S. Cl. .............................. 357/34; 357/54; 357/59
[58] Field of Search ................... 357/34, 54, 59, 90

[56] References Cited

U.S. PATENT DOCUMENTS

| | | | |
|---|---|---|---|
| 3,600,651 | 8/1971 | Duncan | 317/235 R |
| 3,915,767 | 10/1975 | Welliver | 148/190 |
| 4,104,090 | 8/1978 | Pogge | 357/40 |
| 4,157,269 | 6/1979 | Ning et al. | 148/1.5 |
| 4,381,956 | 5/1983 | Lane | 437/38 |
| 4,428,111 | 1/1984 | Swartz | 29/576 E |
| 4,483,726 | 11/1984 | Issac et al. | 148/187 |
| 4,507,847 | 4/1985 | Sullivan | 29/576 B |
| 4,641,416 | 2/1987 | Iranmanesh | 29/576 W |
| 4,675,983 | 6/1987 | Uehara | 29/576 B |
| 4,689,872 | 9/1987 | Appels et al. | 437/228 |
| 4,703,554 | 11/1987 | Havemann | 437/31 |
| 4,706,378 | 11/1987 | Havemann | 437/24 |
| 4,731,341 | 3/1988 | Kawakatsu | 437/31 |
| 4,738,624 | 4/1988 | Iyer et al. | 437/67 |
| 4,745,080 | 5/1988 | Scovell et al. | 437/31 |
| 4,824,794 | 4/1989 | Tabata et al. | 437/89 |
| 4,853,344 | 8/1989 | Darmawan | 437/38 |
| 4,897,363 | 1/1990 | Suda | 357/49 |
| 4,903,104 | 2/1990 | Kawai et al. | 357/35 |
| 4,956,689 | 9/1990 | Yuan et al. | 357/34 |
| 4,980,739 | 12/1990 | Favreau | 357/59 |

OTHER PUBLICATIONS

IBM Technical Disclosure Bulletin, vol. 27, No. 7B, Dec. 1094, by C. G. Jambotkar, "High Performance Transistor Structure", pp. 4517–4520.
IBM Technical Disclosure Bulletin, vol. 24, No. 11A, Apr. 1982 by C. G. Jambotkar "Enhancing the Performance of Bipolar Transistors" pp. 5563–5566.

Primary Examiner—Mark V. Prenty
Attorney, Agent, or Firm—Jeffrey L. Brandt; Harold Huberfeld

[57] ABSTRACT

There is provided a method for use in the fabrication of a transistor, the method including the steps of: providing a substrate of semiconductor material including a region of first conductivity type; forming a first layer of second conductivity type epitaxial semiconductor material over the region; forming a second layer of second conductivity type epitaxial semiconductor material over the first layer, the second layer of a relatively higher dopant concentration than the first layer; oxidizing a portion of the second layer; and removing the oxidized portion of the second layer to expose a portion of the first layer, the exposed portion of the first layer forming an intrinsic base region. The steps of forming the first and second layers are preferably performed using low temperature, ultra-high vacuum, epitaxial deposition processes.

12 Claims, 3 Drawing Sheets

NARROW BASE TRANSISTOR AND METHOD OF FABRICATING SAME

This application is a division of application Ser. No. 07/405,508, filed Sep. 11, 1989, now U.S. Pat. No. 5,008,207.

The present invention relates generally to semiconductor devices and more particularly to bipolar transistors and methods of fabricating the same.

BACKGROUND OF THE INVENTION

In fabricating a vertical, bipolar transistor, it is generally desirable to minimize the device collector-base capacitance, $C_{cb}$ (i.e. the capacitance between the adjoining base and collector regions). Such capacitance typically has the undesirable effect of decreasing device switching speed, and increasing the device switching voltages. It is further desirable to minimize the device base-width, narrow base-width devices typically exhibiting improved performance.

One method of minimizing the undesirable collector-base capacitance is to minimize the P-N junction area between the device base and collector regions. Along the same lines, this capacitance $C_{cb}$ also decreases as the distance between the base contact and the device collector region is increased. These goals, however, typically conflict with the requirement to make a reliable, low resistance electrical connection to the base region. Such connection is often accomplished through the use of a large extrinsic base region, increasing the area of the base-collector P-N junction, and a large extrinsic base contact positioned close to the device surface.

U.S. Pat. No. 3,600,651 shows transistor structures wherein a polycrystalline layer is deposited on a masked semiconductor region. The result of this deposition is a monocrystalline region over the semiconductor material and contiguous polycrystalline regions over the masked, insulating material. Active device regions are then formed in the monocrystalline region, while device contacts are formed to the polycrystalline regions.

U.S. Pat. No. 4,483,726 shows a vertical, bipolar transistor wherein substrate silicon is oxidized to form isolating spacers between the device emitter and extrinsic base region/contact.

U.S. Pat. No. 4,428,111 shows a vertical, bipolar transistor wherein the layers forming the active base, collector and emitter regions are grown using molecular beam epitaxy (MBE). These layers are then processed to form the transistor, and device contacts made thereto.

OBJECTS OF THE INVENTION

An object of the present invention is to provide a new and improved vertical, bipolar transistor.

Another object of the present invention is to provide such a transistor having a decreased collector-base capacitance relative to the prior art.

A further object of the present invention is to provide such a transistor having a very narrow, highly uniform base region.

Yet another object of the present invention is to provide such a transistor having a thin, low resistance extrinsic base region for making electrical contact to the intrinsic base region.

Yet a further object of the present invention is to provide a method for manufacturing such a transistor.

SUMMARY OF THE INVENTION

In accordance with one embodiment of the present invention, there is provided a new and improved method for use in the fabrication of a transistor, the method comprising the steps of: providing a substrate of semiconductor material including a region of first conductivity type; forming a first layer of second conductivity type epitaxial semiconductor material over the region; forming a second layer of second conductivity type epitaxial semiconductor material over the first layer, the second layer of a relatively higher dopant concentration than the first layer; oxidizing a portion of the second layer; and removing the oxidized portion of the second layer to expose a portion of the first layer, the exposed portion of the first layer forming an intrinsic base region. The steps of forming the first and second layers are preferably performed using low temperature, ultra-high vacuum, epitaxial deposition processes.

In accordance with another embodiment of the present invention, there is provided a vertical bipolar transistor, comprising: a substrate of semiconductor material including a region of a first conductivity type; a first layer of epitaxial semiconductor material of a second conductivity type overlying the region; a second layer of epitaxial semiconductor material of the second conductivity type overlying the first layer, the second layer having a greater dopant concentration than the first layer; and the second layer defining an aperture exposing a portion of the first layer; the exposed portion of the first layer forming an intrinsic base region for the transistor.

BRIEF DESCRIPTION OF THE DRAWINGS

These and other objects, features, and advantages of the present invention will become apparent upon a consideration of the following detailed description of the invention when read in conjunction with the drawing Figures, in which.

DETAILED DESCRIPTION OF THE INVENTION

Figure 1A:
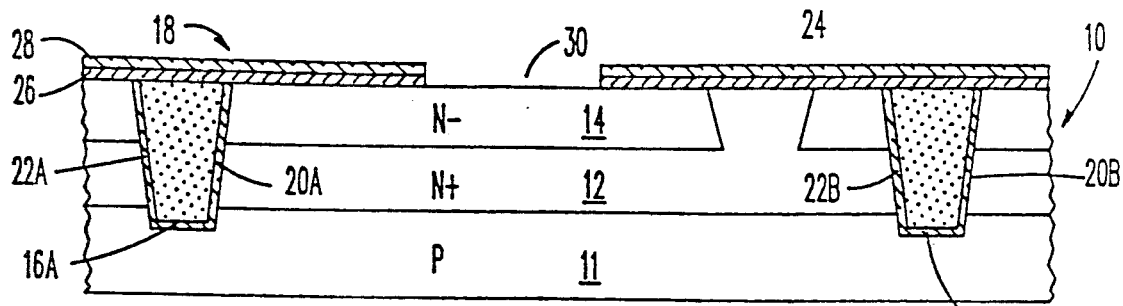
FIGS. 1A-1M comprise a series of cross-sectional views illustrating consecutive steps in the fabrication of a bipolar transistor in accordance with a first embodiment of the present invention.

Referring now to FIG. 1A, a portion of a semiconductor chip 10 includes a substrate 11 of P type monocrystalline silicon semiconductor material, the substrate having disposed thereon a subcollector layer 12 of N+ silicon and an overlying epitaxial layer 14 of N− silicon. It will be understood that references to "N" and "P" type semiconductor materials designate dopant conductivity types, and, where appropriate, the relative dopant concentrations of the materials.

A pair of spaced isolation tranches 16A, 16B extend from the surface of epitaxial layer 14 downward through subcollector layer 12 and into substrate 11, thereby electrically isolating a device region 18 to contain a subsequently fabricated transistor. Trenches 16A, 16B each include an electrically insulating lining or wall 20A, 20B, respectively. The trenches within walls 20A, 20B are filled with an appropriate material, for example intrinsic polysilicon as indicated at 22A, 22B.

A subcollector reachthrough region 24 of highly doped N+ silicon extends from the surface of epitaxial layer 14 downward into contact with subcollector region 12, this reachthrough region being positioned towards the right-hand side of device region 18. Consecutive, 400 Angstrom layers of silicon dioxide ($SiO_2$) 26 and silicon nitride ($Si_3N_4$) 28 overlie the surface of chip 10, including epitaxial layer 14 and isolation trenches 16A, 16B. Oxide and nitride layers 26, 28 are patterned to provide an aperture 30 exposing a portion of epitaxial layer 14 generally centered between isolation trenches 16A, 16B in device region 18.

It will be appreciated by those skilled in the art that the above-described structure of FIG. 1A is generally conventional, and can be formed using selected ones of many known semiconductor manufacturing techniques. U.S. Pat. Nos. 4,473,598 to Ephrath et al. and 4,104,086 to Bondur et al. (both assigned to the assignee of the present invention), for example, each show and describe methods of forming doped silicon regions isolated by trenches of the type shown in FIG. 1. Subcollector reachthrough region 24 can be formed using conventional ion implantation (I/I) or diffusion techniques, while layers 26, 28 can be grown using conventional chemical vapor deposition (CVD) processes. Oxide layers such as layer 26 can also be formed using conventional thermal oxidation techniques. As will be appreciated from a further consideration of the below-described process, the exact thicknesses of layers 26, 28 is not critical to the practice of the present invention.

To best illustrate the present invention, FIGS. 1B-1M are enlarged with respect to FIG. 1A to show the area around aperture 30. FIGS. 1E-1L show the left-most side of the symmetrical device.

Figure 1B:
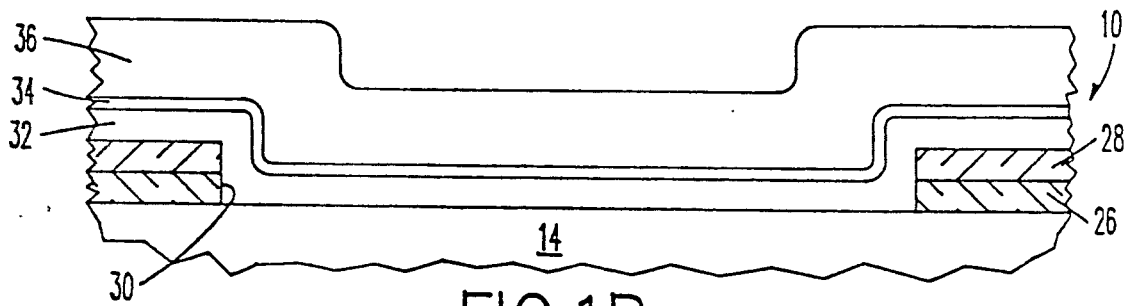

Referring now to FIG. 1B, a layer 32 of P-epitaxial silicon is formed over the device surface to a thickness of about 400 Angstroms. Layer 32 is preferably formed using a low-temperature, ultra-high vacuum, epitaxial process of the type described in the article: "Low-temperature Silicon Epitaxy by Ultrahigh Vacuum/Chemical Vapor Deposition", by B. S. Meyerson, Applied Phsyics Letter 48 (12), Mar. 24, 1986, pgs. 797-799 (incorporated herein by reference). Epitaxial silicon layers formed by this process are known to possess very sharply defined doping profiles. Thusly formed, layer 32 will have a monocrystalline structure overlying epitaxial layer 14 within aperture 30, and a polycrystalline structure overlying nitride layer 28. Layer 32 is preferably formed to have a dopant concentration of less than about $1 \times 10^{19}$ atoms/cm$^3$.

As an example, this low temperature epitaxial process can comprise subjecting the device to a gaseous mixture of $SiH_4/H_2$ and $B_2H_6$ (the dopant), in a flowing gaseous stream, at a temperature of less than about 700 degrees centigrade and a pressure of about $10^{-3}$ torr, and for a time sufficient to achieve the desired thickness. Typically, these low temperature, ultra-high vacuum epitaxial processes are carried out at a temperature in the range of about 500-800 degrees centigrade, and at a vacuum in the range of about $10^{-4}$-$10^{-2}$ torr during deposition.

It will be appreciated that substantially the same process can be used with the optional introduction of a finite amount of Ge to form a heterojunction at the boundary between region 14 and layer 32. In a manner well known in the art, such a heterojunction structure would provide the advantage of lowering the bandgap at that transistor junction, and the benefits concurrent therewith.

Using substantially the same low temperature epitaxial process described above (with the exclusion of the $B_2H_6$ dopant), an optional layer 34 of intrinsic (or undoped) epitaxial silicon is formed on the surface of layer 32 to a thickness of about 300 Angstroms. Utilizing the same process once again, a layer 36 of highly doped P++ epitaxial silicon is formed on the surface of layer 34 to a thickness of about 1,000 Angstroms. Layer 36 is preferably formed, by controlling the concentration of the dopant, to have a dopant concentration of greater than about $5 \times 10^{20}$ atoms/cm$^3$. The use of this low temperature epitaxial process to form at least two relatively thin, epitaxial, silicon layers of differing dopant concentrations comprises a key feature of the present invention as will be discussed in further detail below.

Figure 1C:
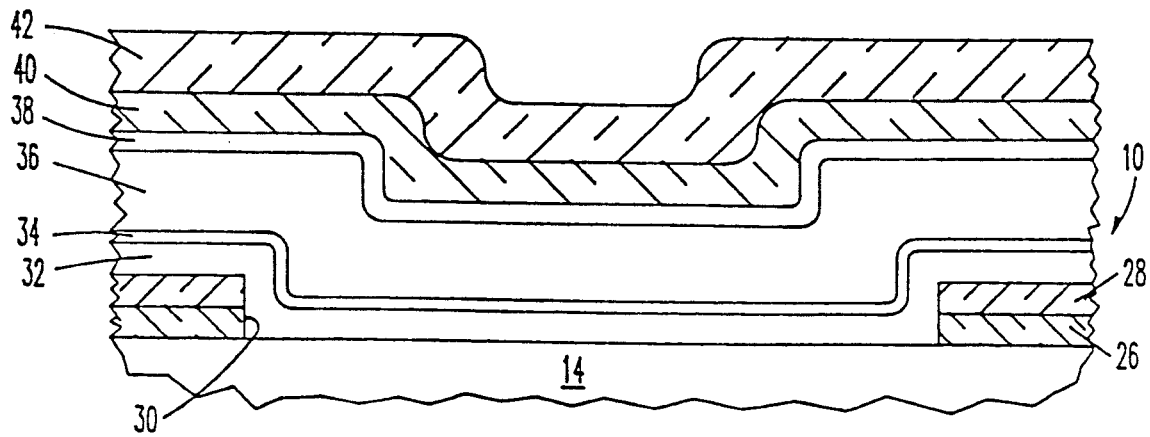

Referring now to FIG. 1C, a layer 38 of undoped silicon is formed conformally over the surface of layer 36 to a thickness of about 250 Angstroms. Layer 38 is formed using a low temperature process, for example either a conventional CVD process (to form polysilicon) or a low temperature epitaxial growth process (to form single-crystal silicon), so as not to disturb the dopant profiles of layers 32, 34, 36. Layer 38 is selected to be a material resistant to a subsequent oxidation process, for example the lightly doped silicons described above, or, for example, a nitride. The use of layer 38 comprises a significant feature of the present invention, permitting the subsequent formation of insulating sidewalls in a manner described below.

Subsequent to the formation of layers 32, 34, 36, 38, the regions of these layers extending beyond the immediate area of aperture 30 are removed (not shown) using conventional photoresist masking and etching techniques. Registered portions of layers 32, 34, 36, 38 are permitted to extend a lateral distance beyond aperture 30 sufficient to accommodate a metal electrical connection in a known manner.

Subsequent to the etching of layers 32, 34, 36, 38, a layer 40 of silicon dioxide is formed conformally over the device to a thickness of about 500 Angstroms. A layer 42 of silicon nitride is formed conformally over layer 40. Both layers 40 and 42 can be formed using conventional, low temperature plasma CVD processes.

Figure 1D:
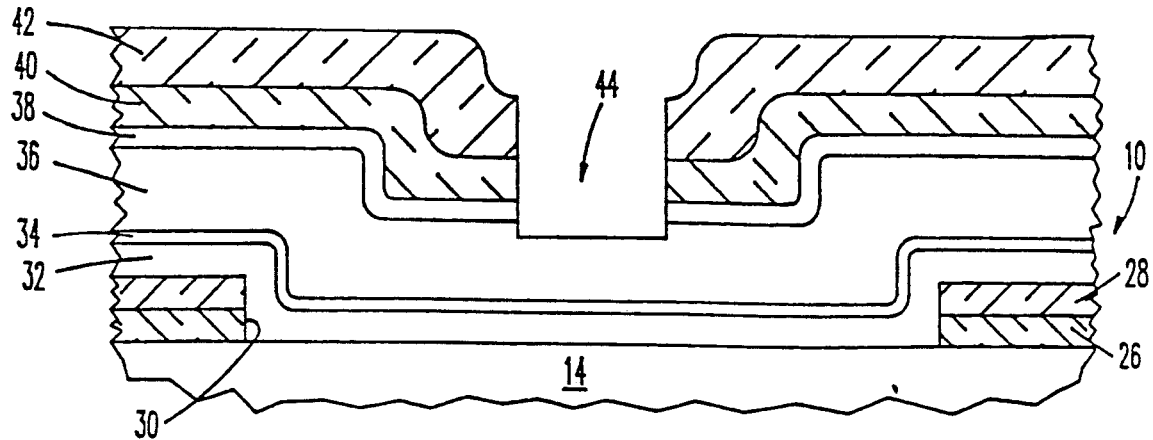

Referring now to FIG. 1D, anisotropic reactive ion etch (RIE) processes are used with a conventional photoresist mask (not shown) to form an aperture 44 generally centered within aperture 30. Aperture 44 extends through layers 38, 40, 42 and approximately half-way through layer 36 (i.e. 500 Angstroms). $CF_4$ plasma, for example, can be used to etch aperture 44.

Figure 1E:
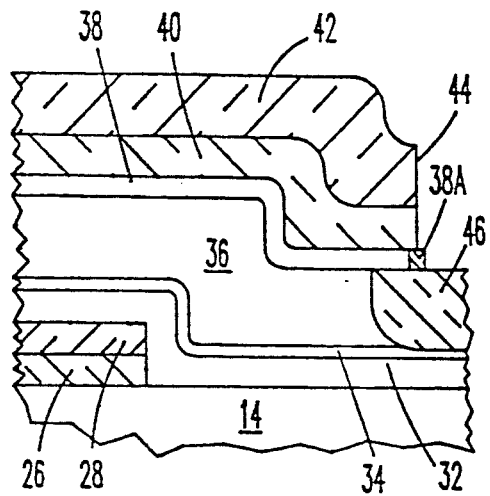

Referring now to FIG. 1E, the portion of epitaxial silicon layer 36 exposed in aperture 44 is subjected to a thermal oxidation process so as to convert a region 46 into silicon dioxide. This thermal oxidation process is preferably a low temperature, high pressure process selected such that the temperature does not disturb the doping profiles of the underlying silicon layers. The oxidation process can comprise, for example, an exposure to a 600 degree centigrade steam environment, at a pressure of about 10 atmospheres, for a time of about 25 minutes. With the temperature of this oxidation process controlled to be less than about 700 degrees centigrade, the process is highly selective (by a factor of about 10x) to both silicon layers 38 and 34.

Because layer 36 oxidizes much more quickly than intrinsic layer 34, the oxidation process will be substantially slowed at layer 34. The resulting oxide region 46 includes all of layer 36 exposed within aperture 44 (oxide region 46 also growing upwards), a very thin, upper portion of layer 34, and a portion of layer 36 extending a lateral distance of about 500 Angstroms beyond the periphery of aperture 44 underneath of polysilicon layer 38. This thermal oxidation process will further oxidize an edge portion 38A of layer 38, to a thickness of approximately 100 Angstroms.

The process of the present invention can now be continued with either an isotropic (wet) or anisotropic (dry) etch. The embodiment using a wet etch will be described first with respect to FIG. 1F, and the embodiment using a dry etch will be described next with respect to FIG. 1F'. Regardless of the embodiment utilized, the identical process steps are continued onward from FIG. 1G.

Figure 1F:
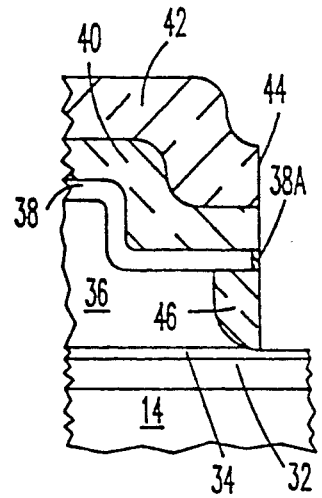
Figure 1F:
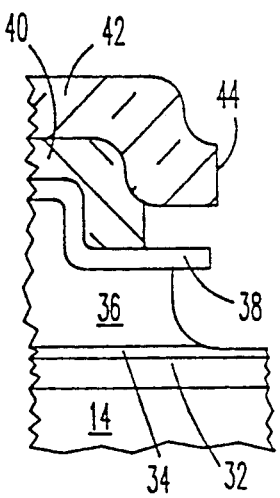

Referring now to FIG. 1F, the device is subjected to a dip in an etchant such as BHF or dilute HF to remove oxide regions 46 and 38A. This etching step further removes a portion of oxide layer 40 extending approximately 1,000–2,000 Angstroms laterally back from the edge of aperture 44 underneath of nitride layer 42.

Describing the alternative embodiment shown in FIG. 1F¹, the device is subjected to appropriate masking (not shown), and a RIE process using, for example, a $CF_4/CHF_3/Ar$ plasma selective to oxide layer 46 vs. underlying silicon layer 34. This etching step provides the remaining spacer 46 with a vertical, exposed sidewall, and avoids the underetching of layer 40 described above. (The remaining process steps 1G–1M are identical regardless of whether wet or dry etching is used. However, the under etch of layer 40 would not be present.)

As mentioned above, the use of a more highly doped layer of epitaxial silicon (layer 36) overlying a more lightly doped region of epitaxial silicon (layer 34 and/or layer 32) comprises a major feature of the present invention. Because the more heavily doped epitaxial silicon (layer 36) oxidizes faster than the lesser doped epitaxial silicon (layer 34), the oxidation (FIG. 1E) and subsequent etching (FIG. 1F) can be used to define a very narrow base region (remaining layers 32, 34) for a subsequently formed vertical bipolar transistor. It will be appreciated that intrinsic silicon layer 34 is optional, because the differences in the dopant concentrations of layers 36 and 32 can be selected to provide the desired selectivity in oxidation and hence etching.

Figure 1G:
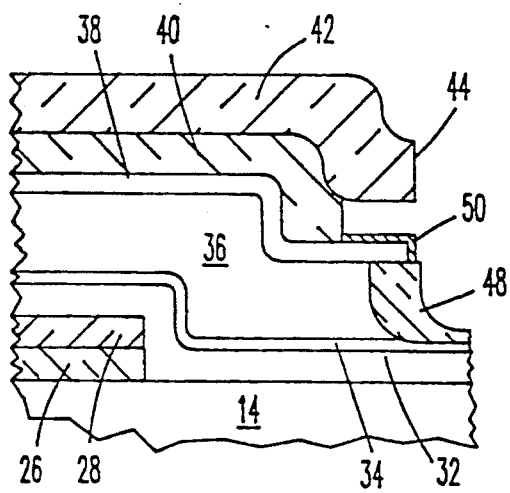

Referring now to FIG. 1G, the device is subjected to a second low temperature, high pressure, thermal oxidation process, for example a 700 degree centigrade steam environment at 10 atmospheres and for a duration of about 50 minutes. A spacer 48 of silicon dioxide is thus formed on the edge of layer 36 extending approximately 1,000 Angstroms from the edge of aperture 44 laterally underneath of layer 38. (This spacer 48 would have already been in place after the dry etch of FIG. 1F', and slightly thickened here.) This same thermal oxidation process further forms a thin layer 50 (i.e. approximately 100–300 Angstroms) of oxide on the exposed surface of polysilicon layer 38. As will be described in further detail below, spacer 48 is used as part of an insulator to electrically isolate an extrinsic base region from an emitter contact.

As mentioned above, layer 38 comprises a key feature in this embodiment of the present invention. More particularly, the present inventors have determined that the use of layer 38 permits the oxidation (FIG. 1E), removal (FIG. 1F), and reoxidation (FIG. 1G) of layer 36, without the formation of a bird's beak lifting of the overlying layers 40, 42, or the erosion of layer 36.

Figure 1H:
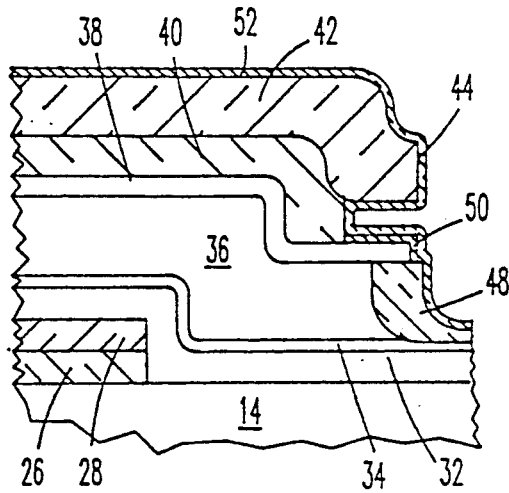
Figure 1I:
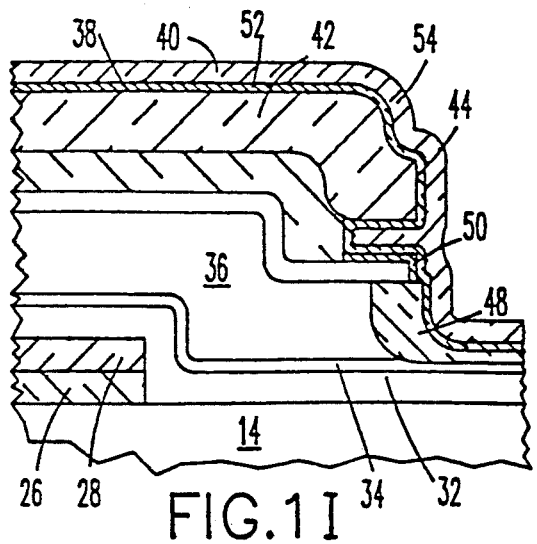

Referring now to FIG. 1H, a conventional CVD process is used to form a layer 52 of silicon nitride conformally over the device to a thickness of about 500 Angstroms. As is shown in FIG. 1I, a conventional CVD process is then used to form a layer 54 of silicon dioxide conformally over the device to a thickness of about 2,000 Angstroms. From a consideration of these last two described FIGS., it will be understood that, while nitride layer 52 lined the undercut edge of uppermost nitride layer 42, oxide layer 54 is of a sufficient thickness to fill that undercut. Oxide layer 54 thus forms a generally smooth vertical liner on the walls of aperture 44.

Figure 1J:
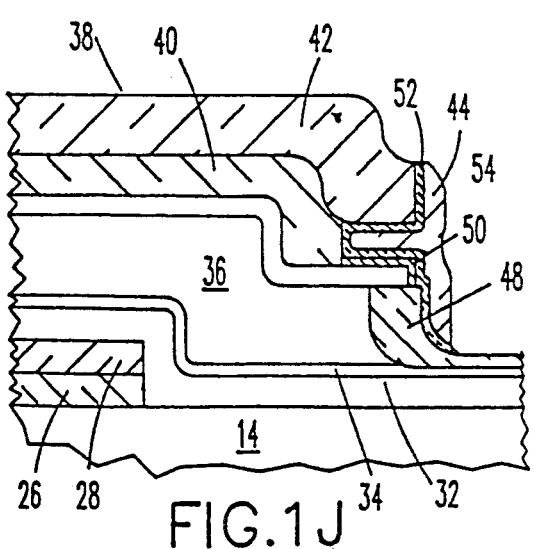

Referring now to FIG. 1J, a RIE process, for example using an $CF_4/CHF_3/Ar$ plasma, is used to remove horizontal portions of oxide layer 54. This RIE process slows on nitride layer 52 so as to leave a vertical oxide sidewall within aperture 44. The device is then subjected to another RIE process, using for example a $Cl_2/O_2/Ar$ plasma to remove the exposed portions of nitride layer 52. This last etch is slowed when oxide layer 48 is exposed at the bottom of aperture 44, and is not permitted to extend any substantial distance into nitride layer 42.

Figure 1K:
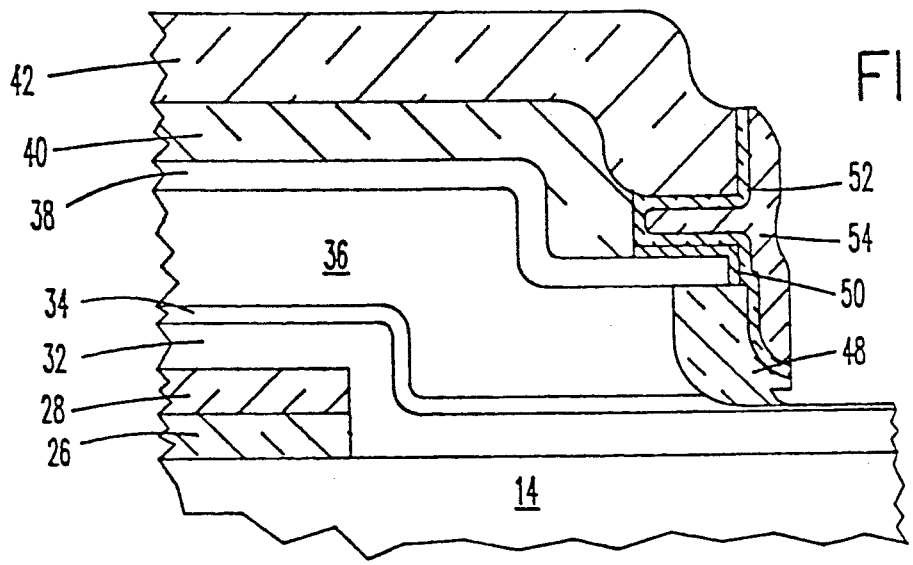

Referring now to FIG. 1K, the device is dipped in an etchant such as BHF or dilute HF to remove the exposed portion of oxide region 48 at the bottom of aperture 44, thereby uncovering underlying layer 34. It will be noted that this etching step also yields a slight undercut into the bottom of oxide region 48 laterally outward from aperture 44. A sidewall portion of oxide layer 54 remains because of its relative thickness in comparison to the etched layer 48.

Figure 1L:
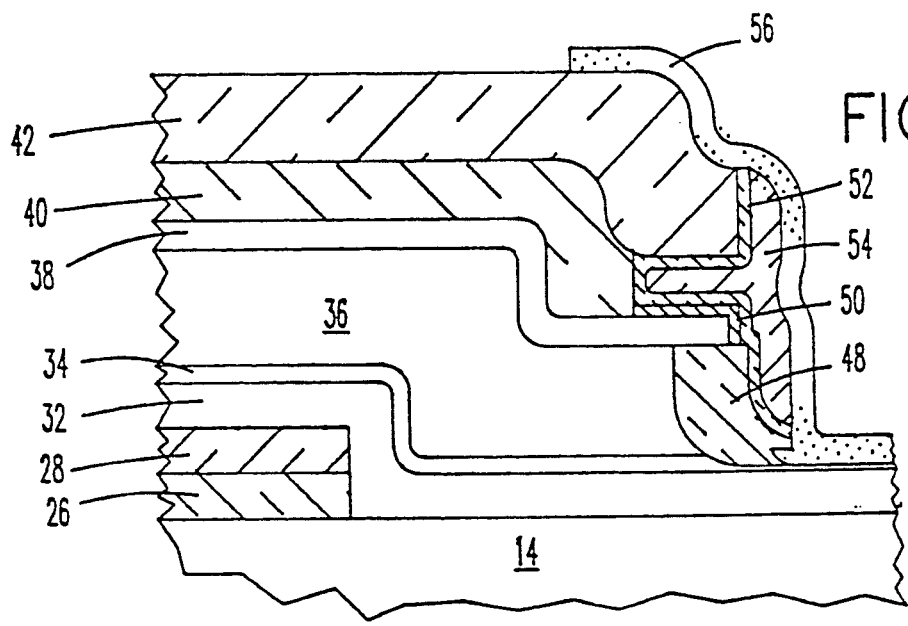
Figure 1M:
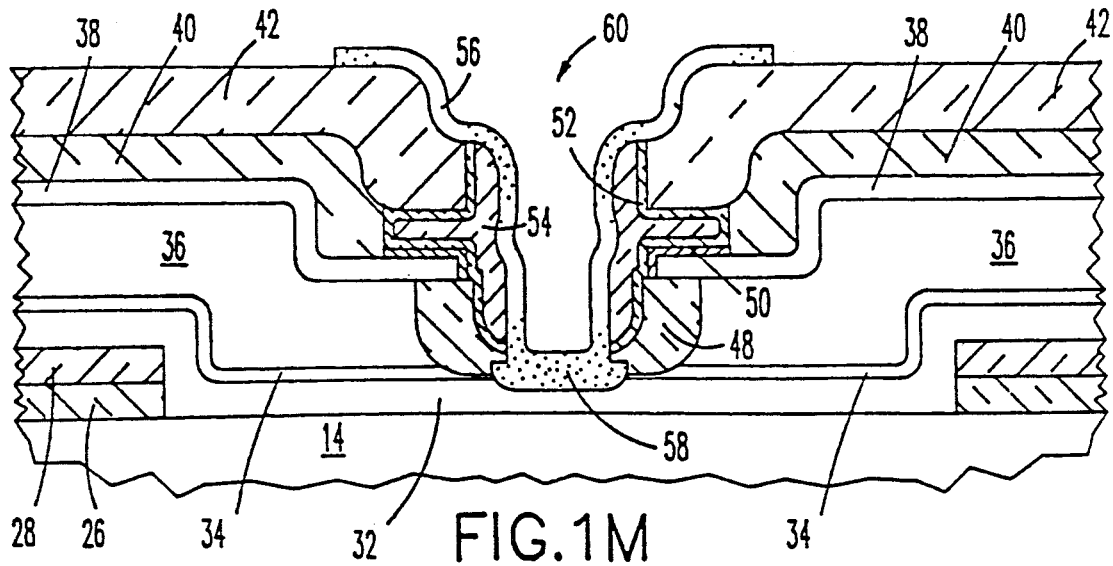

Referring now to FIG. 1L, a layer 56 of polysilicon is formed on the surface of the device using a conventional CVD process to a thickness of about 1,800 Angstroms. This layer of polysilicon is patterned, using conventional photolithographic masking and etching processes, to leave an emitter contact generally within aperture 44 as shown in FIG. 1L. Polysilicon layer 56 is preferably doped to an N+ concentration using a conventional process of ion implanting N ions such as Arsenic, and the device is then annealed to form emitter region 58 as shown in FIG. 1M. This annealing step also has the effect of driving P type dopant from the remaining portions of P++ layer 36 into intrinsic polysilicon layer 34, and also into layer 32. This outdiffusion of dopant into layers 34, 32 decreases the resistance of the extrinsic base area of the subsequently formed transistor.

Referring now to the device shown in FIG. 1M, there is thus formed a vertical bipolar, NPN transistor 60 wherein layers 14 and 32 within aperture 44 form the collector and intrinsic base, respectively. Region 58 forms the transistor emitter, while polysilicon layer 56 forms a self-aligned contact to the emitter. Because the above-described annealing step formed an electrical connection between epitaxial silicon layers 36 and 32, layer 36 functions both as an extrinsic base region and an extrinsic base contact for intrinsic base region 32. Oxide region 48 functions to electrically isolate emitter region 58 from the extrinsic base region.

To complete the device, separate electrical contacts can be formed to extrinsic base region 36 at a location spaced laterally from aperture 44, to emitter contact 56, and to the surface of subcollector reachthrough region 24 (FIG. 1A). The formation of these metal contacts is conventional in the art, and is not described in detail herein.

The resulting transistor 60 includes an intrinsic base region (layer 32 in registry with aperture 44) much narrower (about 500 Angstroms) than can typically be achieved using prior art ion implantation doping processes. Because the base region is formed on top of collector region 14 (vs. in the collector region as is typical in the prior art), the $C_{cb}$ of transistor is very small. Further, the extrinsic base region is thin, possessed of a desirably low resistance, and, because it is self-aligned to the intrinsic base region, is not prone to alignment problems.

There is thus provided a method of forming high-performance, vertical, NPN bipolar transistors having narrow base regions. The method provides, as a key feature of forming the narrow base region, thin, overlapping layers of epitaxial silicon wherein the upper layer is more highly doped than the lower layer. These layers are preferably formed through a process of low temperature, high pressure, epitaxial silicon growth, providing the desired thin layers with sharp dopant variances. Utilizing these two layers of epitaxial silicon in selective oxidation and etching processes, a narrow base region is formed having an extrinsic base and extrinsic base contact. Several methods are provided for forming insulating spacers to isolate the extrinsic base and emitter regions. The present invention has utility in the formation of semiconductor transistors, and more particularly in the formation of high performance bipolar transistors for VLSI circuits.

While the present invention has been shown and described with respect to specific embodiments, it is not so limited. Numerous modifications, changes and improvements will occur to those skilled in the art without departing from the spirit and scope of the present invention.

What is claimed is:

1. A vertical bipolar transistor, comprising:
   a substrate of semiconductor material including a region of a first conductivity type;
   a first layer of epitaxial semiconductor material of a second conductivity type overlying said region;
   a second layer of epitaxial semiconductor material of said second conductivity type overlying said first layer, said second layer having a greater dopant concentration than said first layer;
   said second layer defining an aperture exposing a portion of said first layer;
   the exposed portion of said first layer forming an intrinsic base region for said transistor; and
   a spacer of insulating material on the sidewall of said aperture, said spacer including a vertically disposed, multilayer stack having a region of silicon dioxide, a layer of silicon nitride overlying said region of silicon dioxide, and a layer of silicon dioxide overlying said layer of silicon nitride.

2. The transistor of claim 1 and further including a layer of doped polysilicon extending down the sides of said aperture over said spacer and into contact with the exposed portion of said first layer.

3. The transistor of claim 2 and further including an emitter region of said first conductivity type extending from said layer of doped polysilicon into said first layer.

4. The transistor of claim 1 wherein said substrate and said first and second layers comprise silicon.

5. The transistor of claim 1 and further including a layer of protective material overlying said second layer.

6. A vertical bipolar transistor, comprising:
   a substrate of semiconductor material;
   a layer of insulating material overlying said substrate and defining a window exposing a region of first conductivity type in said substrate;
   a first layer of epitaxial semiconductor material of a second conductivity type overlying said insulating material and said region;
   a second layer of epitaxial semiconductor material of said second conductivity type overlying said first layer, said second layer having a greater dopant concentration than said first layer;
   said second layer defining an aperture exposing a portion of said first layer;
   the portion of said first and second layers within said window overlying said region of first conductivity type being monocrystalline in structure, and the portion of said first and second layers overlying said layer of insulating material being polycrystalline in structure;
   a spacer of insulating material on the sidewall of said aperture;
   a layer of doped polysilicon extending down the sides of said aperture over said spacer and into contact with the exposed portion of said first layer; and
   an emitter region of said first conductivity type extending from said layer of doped polysilicon into said first layer.

7. The transistor of claim 6 wherein said substrate and said first and second layers each comprise silicon.

8. The transistor of claim 7 and further including a layer of intrinsic polysilicon overlying said second layer.

9. The transistor of claim 8 and further including:
   an isolation trench surrounding said region of first conductivity type in said substrate to electrically isolate said region; and
   a buried subcollector region of said first conductivity type underlying said region, said subcollector region of higher dopant concentration than said region.

10. A vertical bipolar transistor, comprising:
    a substrate of semiconductor material including a region of a first conductivity type;
    a first layer of epitaxial semiconductor material of a second conductivity type overlying said region;
    a second layer of epitaxial semiconductor material of said second conductivity type overlying said first layer, said second layer having a greater dopant concentration than said first layer;
    said second layer defining an aperture exposing a portion of said first layer;
    the exposed portion of said first layer forming an intrinsic base region for said transistor; and a third layer of epitaxial semiconductor material intermediate said first and second layers, said third layer being of said second conductivity type and of a concentration intermediate that of said first and second layers.

11. A vertical bipolar transistor, comprising:
    a substrate of semiconductor material including a region of a first conductivity type;
    a first layer of epitaxial semiconductor material of a second conductivity type overlaying said region;
    a second layer of epitaxial semiconductor material of said second conductivity type overlying said first layer, said second layer having a greater dopant concentration than said first layer; and
    said second layer defining an aperture exposing a portion of said first layer;

the exposed portion of said first layer forming an intrinsic base region for said transistor; and a layer of protective material overlying said second layer and comprising a stack including a layer of oxide-resistant material on said second layer, and a layer of insulating material on said layer of oxide-resistant material.

12. A vertical bipolar transistor, comprising:

a substrate of semiconductor material including a region of a first conductivity type;

a first layer of epitaxial semiconductor material of a second conductivity type overlying said region;

a second layer of epitaxial semiconductor material of said second conductivity type overlying said first layer, said second layer having a greater dopant concentration than said first layer; and said second layer defining an aperture exposing a portion of said first layer;

the exposed portion of said first layer forming an intrinsic base region for said transistor;

a layer of insulating material overlying said substrate and defining a window exposing said first conductivity type semiconductor material; and wherein the portion of said first and second layers overlying said region of first conductivity type semiconductor material are monocrystalline in structure, and the portion of said first and second layers overlying said layer of insulating material are polycrystalline in structure.

* * * * *